United States Patent [19]
Yin

[11] Patent Number: 5,875,127
[45] Date of Patent: Feb. 23, 1999

[54] NON-VOLATILE SEMICONDUCTOR MEMORY DEVICE HAVING A FLOATING GATE STORAGE CAPACITOR AND METHOD OF OPERATING THEREOF

[76] Inventor: Ronald Loh-Hwa Yin, 547 Sullivan Dr., MountainView, Calif. 94041

[21] Appl. No.: 735,650

[22] Filed: Oct. 24, 1996

[51] Int. Cl.$^6$ ..................................................... G11C 16/02
[52] U.S. Cl. ................................ 365/185.2; 365/185.02; 365/185.06; 365/185.13; 365/185.18; 365/185.23; 365/185.25; 365/185.28; 365/175
[58] Field of Search ........................... 365/185.2, 185.02, 365/185.06, 185.13, 185.18, 185.23, 185.25, 185.28, 175

[56] References Cited

U.S. PATENT DOCUMENTS

| | | | |
|---|---|---|---|
| 3,986,173 | 10/1976 | Baitinger et al. | 365/154 |
| 4,247,918 | 1/1981 | Iwahashi et al. | 365/218 |
| 4,920,513 | 4/1990 | Takeshita et al. | 365/175 |
| 5,361,225 | 11/1994 | Ozawa | 365/145 |
| 5,379,250 | 1/1995 | Harshfield | 365/105 |

OTHER PUBLICATIONS

"Pinch Load Resistors Shrink Bipolar Memory Cells" by S.K. Wiedmann, *Electronics*, Mar. 7, 1974, pp. 130–133.
*Intuitive IC Electronics* by Thomas M. Frederiksen, McGraw–Hill Inc., 1989, pp. 193–194.

Primary Examiner—David C. Nelms
Assistant Examiner—Andrew Q. Tran

[57] ABSTRACT

A memory array circuit has a matrix of column lines and row lines. A plurality of non-volatile storage capacitors, each having a floating gate for the storage of charges, are arranged in the matrix. Each storage capacitor has a data node and a voltage node, with a floating gate therebetween. Each of the plurality of non-volatile storage capacitors has an associated column line and an associated row line, with the voltage node connected to the associated row line. A diode connects the data node of a storage capacitor to its associated column line. A first decoder decodes a first address signal and selects one of the column lines. A second decoder decodes a second address signal, and generates a row output signal, with each row output signal of the second decoder having a corresponding row line. A plurality of voltage control circuits is provided with each voltage control circuit receiving one of the plurality of row output signals, and for applying a control signal to a corresponding row line, in response to a data read signal, a data write to one state signal or a data write to another state signal.

20 Claims, 5 Drawing Sheets

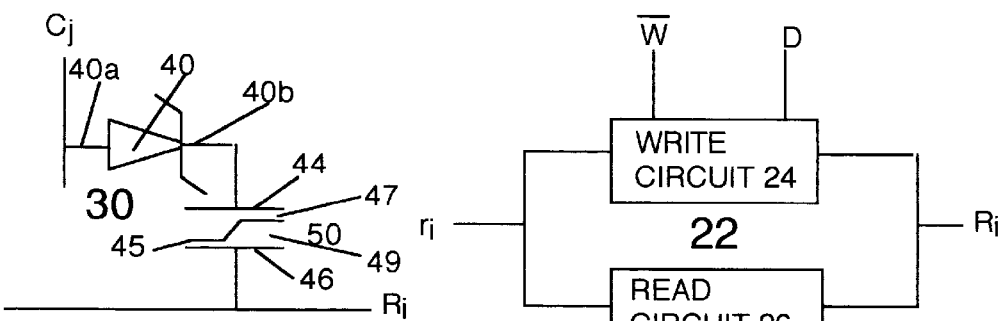
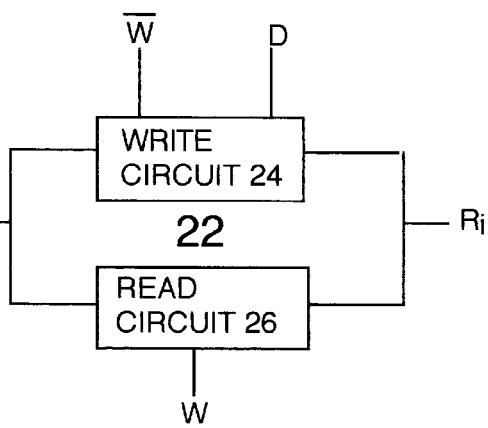
FIG. 2
FIG. 3
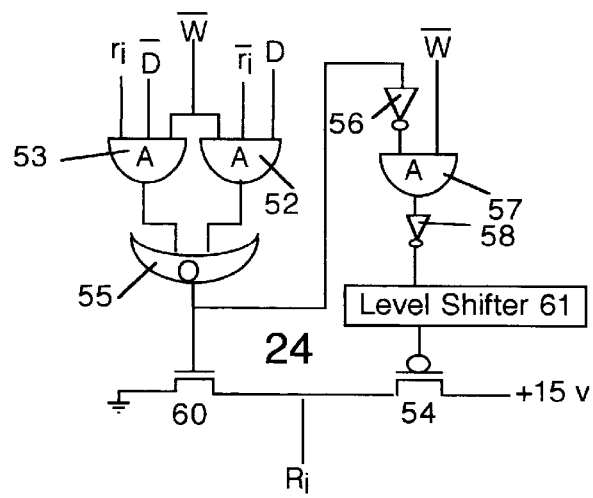
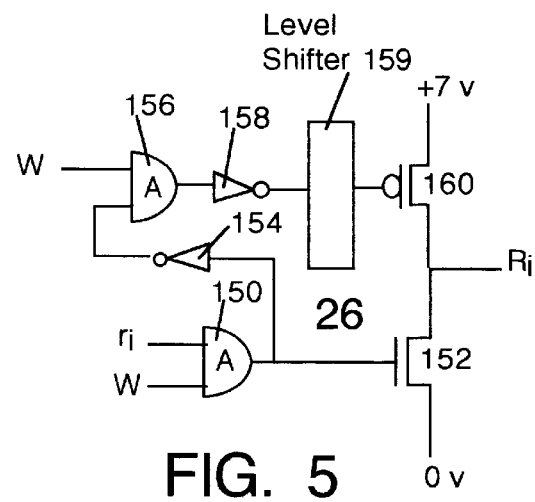
FIG. 4
FIG. 5
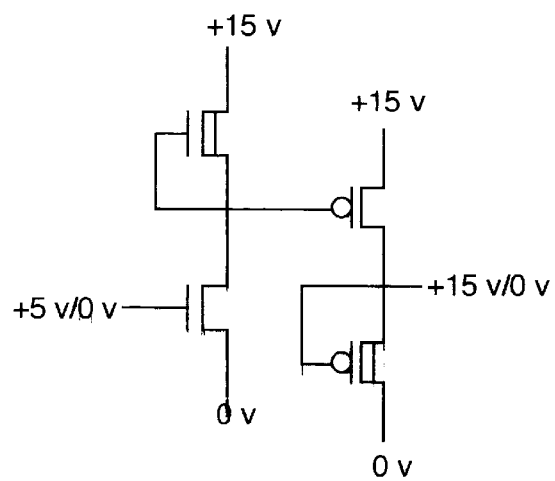
FIG. 6

NON-VOLATILE SEMICONDUCTOR MEMORY DEVICE HAVING A FLOATING GATE STORAGE CAPACITOR AND METHOD OF OPERATING THEREOF

TECHNICAL FIELD

The present invention relates to a semiconductor memory array circuit, and more particularly to a non-volatile memory array circuit whose memory cells are arranged in a matrix of rows and columns, with diodes connecting the non-volatile memory cells to the rows and columns to write data signals into or to read data signals out of a selected memory cell.

BACKGROUND OF THE INVENTION

Semiconductor memory array circuits are well known in the art. There are three types of memory cells which can electrically write data signals into a memory cell and electrically read data signals out of a selected memory cell.

The first type, using a capacitor, is called a Dynamic Random Access Memory (DRAM). The second type, using a latch, is called a Static Random Access Memory (SRAM). A third type using a floating gate to store charges, which controls the action of a channel of a transistor is called Electrically Erasable Programmable Read Only Memory (EEPROM).

In all three types of semiconductor memory array circuit, the memory cells are arranged in a matrix of columns and rows. A column line and a row line can select a particular select transistor which is connected to an associated memory cell. During writing, a data signal (which can be "1" or "0") to be stored in a selected memory cell is supplied on a column line. The activation of a particular row line, which is connected to the gate of a select transistor, causes the data signal to be passed through the select transistor associated with the select memory cell and to be stored in the select memory cell.

In a DRAM device the memory cell is a capacitor with one electrode of the capacitor connected to the selected transistor, and the other electrode of the capacitor connected to ground. The memory array is typically segmented into two sections. During read, the corresponding column lines of the two memory sections are pre-charged. The select capacitor in one memory section is connected to one pre-charged column line. A sense amplifier differentially senses the charges between the two pre-charged column lines.

In an SRAM device there are two column lines with two select transistors, causing the data signal and its complement to be stored in the latch. During read operation, a particular pair of column line is precharged. A particular row line is then activated turning on the pair of select transistors causing the state of the selected memory cell to be read out and supplied to the precharged column lines. The change on the charge of the pre-charged column lines from one another determines the state of the selected memory cell.

In U.S. Pat. No. 3,986,173 reference is made to the use of diodes to transfer data signals into a bipolar latch. However, the diodes were deemed not suitable and disclosure is made to the use of select transistors. In addition, that reference taught the use of tow column lines per latch. see also "Pinch Load resistors Shrink Bipolar Memory Cells" by S. K. Wiedmann, Electronics, Mar. 7, 1974, p. 130–133.

In a flash EEPROM, the charges stored on a floating gate of the selected transistor determines the amount of current that passes through the channel of the select transistor.

Semiconductor memory designers have sought to increase the density of semiconductor memory array circuit, by packing more memory cells in each integrated circuit. This has been accomplished primarily by reducing the size of the transistors which are used in the memory array circuit. However, each transistor is fabricated laterally or planarly on a semiconductor substrate, such as single crystalline silicon. Thus, select transistors take up lateral surface area on a semiconductor substrate.

Control circuits interfacing a row decoder and row lines for controlling the voltages applied to the row lines during read, erase, and program in an EEPROM device is also well known in the art. See for example, U.S. Pat. No. 4,427,918.

SUMMARY OF THE INVENTION

The present invention comprises an arrangement of a plurality of first lines (such as column lines) and a plurality of second lines (such as row lines). The plurality of first lines and plurality of second lines define a matrix. A plurality of non-volatile storage cells are arranged in the matrix, with each non-volatile storage cell having a data node and a voltage node. Each of the plurality of non-volatile storage cells has an associated first line and an associated second line, with the voltage node connected to the associated second line. A diode connects the data node of a non-volatile storage cell to its associated first line. A first decoder decodes a first address signal and selects one of the first lines. A second decoder decodes a second address signal, and generates an output signal, with each output signal of the second decoder having a corresponding second line. A plurality of voltage control circuits is provided with each voltage control circuit receiving one of the plurality of output signals, and for applying a control signal to the corresponding second line, in response to a data read signal, a data write to one state signal or a data write to another state signal.

BRIEF DESCRIPTION OF THE DRAWINGS

FIG. 2 is a circuit diagram of a first embodiment of a memory unit for use in the embodiment of the memory array circuit of the present invention shown in FIG. 1.

FIG. 3 is a block level diagram of an embodiment of a control circuit suitable for use in the embodiments of the memory array circuit shown in FIGS. 1 and 10.

FIG. 4 is a circuit diagram of a write circuit suitable for use in the embodiment of the control circuit shown in FIG. 3.

FIG. 5 is a circuit diagram of a read circuit suitable for use in the embodiment of the control circuit shown in FIG. 3.

FIG. 6 is a circuit diagram of an example of a voltage level shifter for shifting the voltage of an input signal, having 0/+5 volts and for outputting a signal having 0/+15 volts.

DETAILED DESCRIPTION OF THE DRAWINGS

First Embodiment of a Memory Array Circuit

Figure 1:
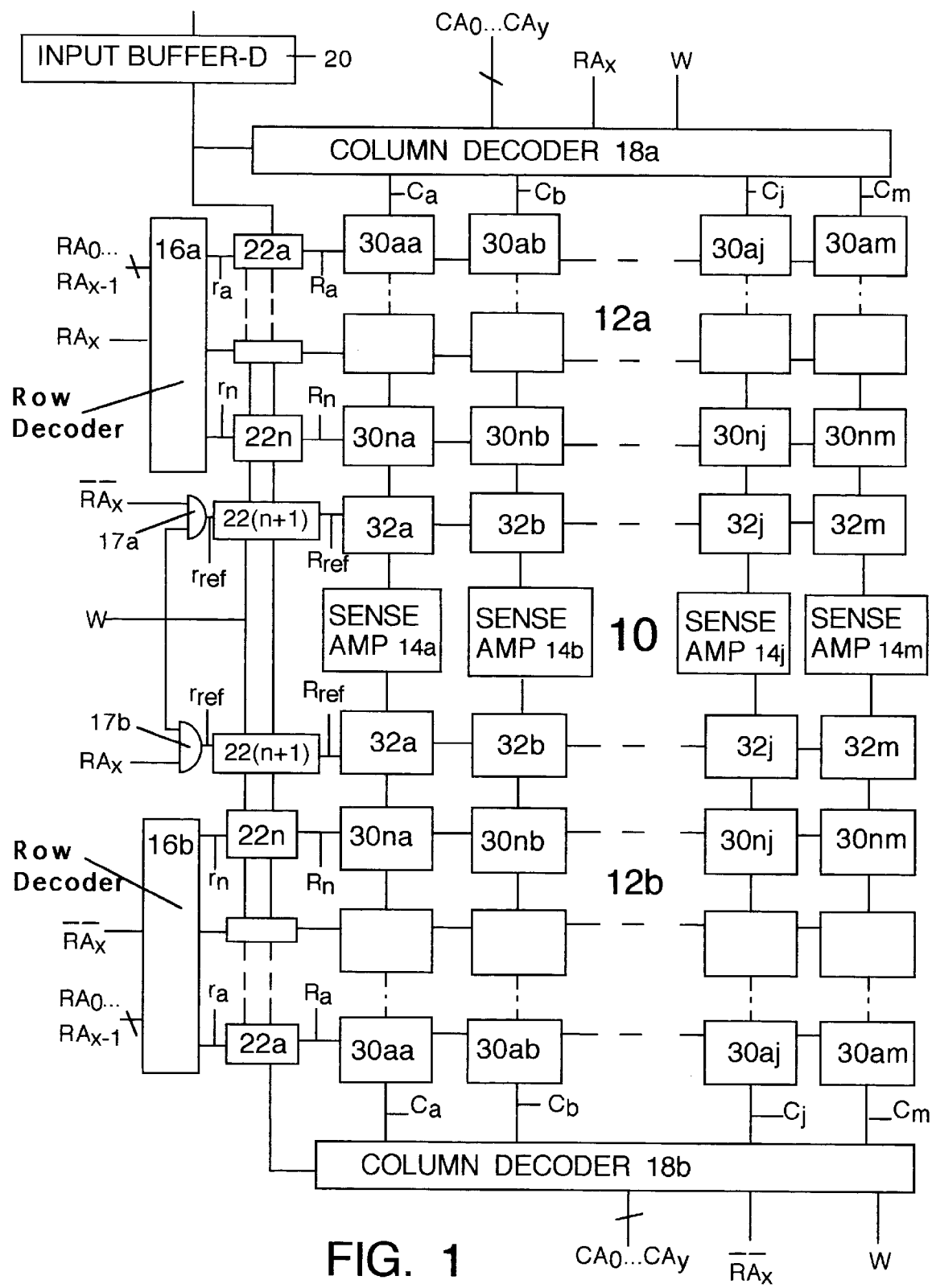
FIG. 1 is a schematic block level diagram of a first embodiment of a memory array circuit of the present invention, suitable for use with memory units comprising non-volatile memory cells.

Referring to FIG. 1 there is shown a block diagram of a first embodiment of a semiconductor memory array circuit 10 of the present invention. The array circuit 10 comprises two sections of memory units: first memory section 12a and second memory section 12b. The first memory section 12a comprises a plurality of data memory units 30aa . . . 30nm arranged in a plurality of n rows and a plurality of m columns, connected by a plurality of n row lines $R_a \ldots R_n$ and a plurality of m column lines $C_a \ldots C_m$. The first memory section 12a also comprises a plurality of reference memory units 32a . . . 32m, connected in a single row $R_{ref}$, with one reference memory unit 32, e.g. 32j, connected to a different column line $C_j$ of the first memory section 12a.

The second memory section 12b also comprises a plurality of data memory units 30aa . . . 30nm also arranged in a plurality of n rows and a plurality of m columns, connected by a plurality of n row lines $R_a \ldots R_n$, and a plurality of m column lines $C_a \ldots C_m$. The second memory section 12b also comprises a plurality of reference memory units 32a . . . 32m, connected in a single row $R_{ref}$, with one reference memory unit 32, e.g. 32j, connected to a different column line $C_j$ of the second memory section 12b.

Each of the memory units 30 and each of the reference units 32 comprises a non-volatile storage capacitor 50 (shown in FIGS. 2, 8, 9 or 11). The reference memory units 32 and the data memory units 30 are identical except for the size of the non-volatile storage capacitor 50. As will be discussed in greater detail hereinafter, each non-volatile storage capacitor 50 comprises a first electrode 44, a second electrode 46, with a floating gate 45 therebetween. The non-volatile storage capacitor 50 of a reference memory unit 32 has approximately one-half the storage capacity of the non-volatile storage capacitor 50 of a memory unit 30. This can be accomplished, e.g. by the floating gate 45 of the reference memory unit 32 being approximately one-half the size of the floating gate 45 of the memory unit 30. In addition, the non-volatile storage capacitor 50 of a reference memory unit 32 has approximately one-half the capacitance of the non-volatile storage capacitor 50 of a memory unit 30. This can be accomplished, e.g. by the first electrode 44 of the reference memory unit 32 being approximately one-half the size of the first electrode 44 of the memory unit 30.

A sense amplifier 14 is connected to a column line, e.g. $C_j$, of the first memory section 12a and to a corresponding column line, e.g. $C_j$, of the second memory section 12b. Each sense amplifier 14, e.g. $14_j$, differentially senses the charges on a column line, e.g. $C_j$, of the first memory section 12a, caused by a data memory cell 50 of any of the memory units 30aj . . . 30nj, of the first memory section 12a being connected thereto, with the charges on a corresponding column line $C_j$, of the second memory section 12b, caused by a reference memory unit 32j of the second memory section 12b being connected thereto. The output of each sense amplifier 14 is supplied to an output buffer (not shown).

Within the first memory section 12a, the circuit 10 comprises a first row decoder 16a for receiving and decoding a row address signal $RA_0 \ldots RA_{(x-1)}$. The first row decoder 16a also receives the row address signal $RA_x$. In accordance with industry standard, the row address signals $RA_0 \ldots RA_x$ can be the address signals $A_0 \ldots A_x$ supplied to the array circuit 10 strobed by a control signal RAS. The first row decoder 16a decodes the row address signal $RA_0 \ldots RA_{(x-1)}$, if the row address signal $RA_x$ is high. The output of the first row decoder 16a is a plurality of row output signals, $r_a \ldots r_n$. Each of the row output signals $r_a \ldots r_n$ of the first row decoder 16a is supplied to a control circuit 22a . . . 22n and has a corresponding row line $R_a \ldots R_n$. The row address signal $RA_x$ and the read/write signal W are supplied to an AND gate 17a, to generate the row output signal $r_{ref}$. The row output signal $r_{ref}$ is similar to the row output signals $r_a \ldots r_n$ in that it is supplied to a control circuit 22(n+1), which can be identical to the other control circuits 22, and has a corresponding row line $R_{ref}$ which is connected to all the reference memory units 32. Each of the control circuits 22 receives one of the row output signals $r_a \ldots r_n, r_{ref}$ and the read/write signal W and the state of the input signal D, and in response thereto, supplies an appropriate control signal to its corresponding row line $R_a \ldots R_n, R_{ref}$. The read/write signal W is an active low write signal. Thus, W high indicates active read.

Within the second memory section 12b, the circuit 10 comprises a second row decoder 16b for receiving and decoding a row address signal $RA_0 \ldots RA_{(x-1)}$, which is the same row address signal supplied to the first row decoder 16a. The second row decoder 16b also receives the row address signal $\overline{RA_x}$. The second row decoder 16b decodes the row address signal $RA_0 \ldots RA_{(x-1)}$, if the row address signal $\overline{RA_x}$ is high. Thus, although the same row address signal $RA_0 \ldots RA_{(x-1)}$ is supplied to both the first row decoder 16a and the second row decoder 16b, only one of them will be activated at any time, depending upon the row address signal $RA_x$.

Similar to the first row decoder 16a, the second row decoder 16b has a plurality of row output signals, $r_a \ldots r_n$. Each of the row output signals $r_a \ldots r_n$ of the second row decoder 16b is supplied to a control circuit 22a . . . 22n and has a corresponding row line $R_a \ldots R_n$. The row address signal $RA_x$ and the read/write signal W are supplied to an AND gate 17b to generate the row output signal $r_{ref}$. The row output signal $r_{ref}$ is similar to the row output signals $r_a \ldots r_n$ in that it is supplied to a control circuit 22(n+1), which can be identical to the other control circuits 22, and has a corresponding row line $R_{ref}$ which is connected to all the reference memory units 32. Each of the control circuits 22 receives one of the row output signals $r_a \ldots r_n, r_{ref}$ and the read/write signal W and the state of the input signal D, and in response thereto supplies an appropriate control signal to its corresponding row line $R_a \ldots R_n, R_{ref}$.

Within the first memory section 12a, the circuit 10 comprises a first column decoder 18a. The first column decoder 18a receives the column address signal $CA_0 \ldots CA_y$, which in accordance with industry standard can be the address signals $A_0 \ldots A_y$ supplied to the array circuit 10 strobed by a control signal CAS. The first decoder 18a also receives the row address signal $RA_x$ and the read/write signal W. In response, the first column decoder 18a selects one of the column lines $C_a \ldots C_m$ of the first memory section 12a. The first column decoder 18a is activated if the read/write signal W is high (indicating a read operation), or if the signal $RA_x$ is high.

Within the second memory section 12b, the circuit 10 comprises a second column decoder 18b. The second column decoder 18b receives the same column address signal $CA_0 \ldots CA_y$, as received by the first column decoder 18a, and the row address signal $RA_x$ and the same read/write signal W. In response, the second column decoder 18b selects one of the column lines $C_a \ldots C_m$ of the second memory section 12b.

The second column decoder 18b is activated if the read/write signal W is high (indicating a read operation), or if the signal $RA_x$ is high. Thus, in the event the read/write signal W is high, indicating a read operation, both column decoders 18a and 18b are activated. Since they both receive the same column address signal $CA_0 \ldots CA_y$, the same column line $C_j$ will be chosen, causing the sense amp 14j to sense differentially the charges on the column line $C_j$ of the first memory section 12a from the corresponding column line $C_j$ of the second memory section 12b. In the event the read/write signal W is low, indicating a write operation, then only one of the column decoders 18a or 18b will be active. The choice of the column decoder 18a and 18b that will be active is determined by the signal $RA_x$ and $\overline{RA_x}$. If $RA_x$ is high, then only first column decoder 18a and only first row decoder 16a will be active, thereby activating only the column and row lines of the first memory section 12a. If $\overline{RA_x}$ is high, then only second column decoder 18b and only second row decoder 16b will be active, thereby activating only the column and row lines of the second memory section 12b.

The array circuit 10 also comprises a conventional input buffer 20 for receiving a data signal D that is to be stored in one of the plurality of memory units 30aa ... 30nj of either the first memory section 12a or the second memory section 12b. The input signal D is supplied to each of the control circuits 22.

First Embodiment of A Memory Unit

Referring to FIG. 2, there is shown a memory unit 30 suitable for use with the memory array circuit 10. The memory unit 30 comprises a floating gate storage capacitor 50. The floating gate storage capacitor 50 has a first electrode 44, a second electrode 46, and a floating gate 45 therebetween. Between the first electrode 44 and the floating gate 45 is a first insulating layer 47, such as silicon dioxide or silicon nitride, or combination thereof. Between the floating gate 45 and the second electrode 46 is a second insulating layer 49, such as silicon dioxide or silicon nitride, or combination thereof. The second electrode 46 is connected to the associated row line $R_i$. In the preferred embodiment, the first insulating layer 47 is of the thickness on the order of 50–100 angstroms, which permits electrons to Fowler-Nordheim tunnel from the first electrode 44 to the floating gate 45, and vice versa. Thus, in this manner, electrons are stored on the floating gate 45. However, as it will be clear to those skill in the art, the storage and removal of the electrons from the floating gate 45 can also be done by Fowler-Nordheim tunneling of electrons through the second insulating layer 49, to and from the second electrode 46.

The memory unit 30 also comprises an avalanche diode 40, which has an anode 40a and a cathode 40b. As used herein, the term avalanche diode shall include zener diode or any other form of diode that has both a forward bias conduction state, and a reverse bias breakdown conduction state. The anode 40a is connected to the associated column line $C_j$. The cathode 40b is connected to the first electrode 44. The avalanche diode 40 can be made out of polysilicon and can be placed above the silicon substrate 80. Alternatively, the avalanche diode 40 can be fabricated in the semiconductor substrate 80 with the floating gate storage capacitor 50 thereby fabricated "above" the diode 40.

The principle of operation for writing (state "1", hereinafter described as program operation; and state "0", hereinafter described as erase operation) into the memory unit 30 is that it depends upon the voltage differential between the selected column line $C_j$, and the selected row line $R_i$. In the program operation, the voltage differential between the selected column line $C_j$, and the selected row line $R_i$ causes the diode 40 to forward conduct and causes electrons to Fowler-Nordheim tunnel from the first electrode 44 to the floating gate 45. In the erase operation, the voltage differential between the selected column line $C_j$, and the selected row line $R_i$ causes the diode 40 to reverse conduct and causes electrons to Fowler-Nordheim tunnel from the floating gate 45 to the first electrode 44. Thus, the control circuit 22 supplies a voltage to the select row line $R_i$ to cause a program or erase operation, depending upon the voltage that is applied to the selected column line $C_j$. Furthermore, the principle of operation for reading the state of the memory unit 30 also depends upon the voltage precharged on the selected column line $C_j$ and the voltage applied to the selected row line $R_i$ to cause a conduction of the avalanche diode 40, depending upon the charges stored on the floating gate 45 of the non-volatile capacitor 50.

Therefore, as shown in FIG. 3, the control circuit 22 comprises generally, a write circuit 24 for applying a voltage to the selected row line $R_i$ during write operation, and a read circuit 26 for applying a voltage to the selected row line $R_i$ during read operation. The write circuit 24 and the read circuit 26 are shown in greater detail in FIGS. 4 and 5 respectively. However, based upon the previous discussion, for both read and write operation, the embodiment of the write circuit 24 and the read circuit 26 is only one of many possible embodiments depending upon the voltage of the selected column line $C_j$. Furthermore, for purpose of this discussion, the avalanche diode 40 is assumed to have a forward bias threshold voltage of +0.5v and a reverse breakdown voltage of –15.0 volts. In addition, it is assumed that the voltage necessary to cause Fowler-Nordheim tunneling of electrons from the first electrode 44 to the floating gate 45 and vice versa is +15 volts. Finally, it is also assumed that after programming, i.e. after electrons are Fowler-Nordheim tunneled from the first electrode 44 to the floating gate 45, the floating gate 45 will have a voltage of approximately –3.0 volts. For the purpose of describing the embodiment of the control circuit 22 shown in FIG. 3, the following voltages are assumed.

|  | $C_j$ | $C_i$ | $R_i$ | $R_j$ |
| --- | --- | --- | --- | --- |
| Program | –15 | 0 | +15 | 0 |
| Erase | +15 | 0 | 0 | +15 |
| Read | 0 | f | 0 | +7 | where program is to cause electrons to be stored on the floating gate 45 of the select floating gate capacitor 50 defined at the intersection of column line $C_j$ and row line $R_i$. Erase is to remove the electrons stored on the floating gate 45 of the select floating gate capacitor 50 defined at the intersection of column line $C_j$ and row line $R_i$. Read is to read the state of electrons stored on the floating gate 45 of the select floating gate capacitor 50 defined at the intersection of column line $C_j$ and row line $R_i$. $C_i$ is an unselected column line. f is floating. $R_j$ is an unselected row line.

The write circuit 24 is shown in greater detail in FIG. 4. The write circuit 24 receives a row output signal $r_i$, which is the output of the row decoder 16a or 16b. The row output signal $r_i$ is supplied to an AND gate 53, to which the read/write signal $\overline{W}$, and the input signal $\overline{D}$ are also supplied. The output of the AND gate 53 is supplied to an OR gate 55. The complement row output signal $\overline{r}_i$ is supplied to an AND gate 52, to which the read/write signal $\overline{W}$, and the input signal D are also supplied. The output of the AND gate 52 is supplied to the OR gate 55. The output of the OR gate 55 is supplied to the gate of an N type enhancement MOS transistor 60. One end of the source/drain of the transistor 60 is supplied to ground. The other end of the drain/source of the transistor 60 is connected to the row line $R_i$.

The output of the OR gate 55 is inverted by an invertor 56, whose output is supplied as an input to AND gate 57. Another input to AND gate 57 is the read/write signal $\overline{W}$. The output of the AND gate 57 is inverted by invertor 58, and is then supplied to a level shifter 61. The output of the level shifter 61 is supplied to the gate of a P type enhancement MOS transistor 54. One end of the source/drain of the transistor 54 is connected to +15 volts. The other end of the drain/source of the transistor 54 is connected to the row line $R_i$. The level shifter 61 is used solely to change the level of the voltage from output of the invertor 58, which is assumed to have outputs of +5/+0 volts corresponding to logic states of "1" or high and "0" or low respectively. The level shifter 55 changes the level of the voltage from 0 volts and +5.0 volts to 0 volts and +15 volts. An example of a voltage level shifter for shifting an input signal of 0/+5 volts and for outputting a signal of 0/+15 volts is shown in FIG. 6.

The read circuit 26 is shown in greater detail in FIG. 5. The read circuit 26 comprises an AND gate 150 which receives as its inputs the read/write signal W and the row output signal $r_i$. The output of the AND gate 150 is supplied to the gate of a N type MOS transistor 152. One end of the source/drain of the MOS transistor 152 is connected to 0 volts. The other drain/source end of the transistor 152 is connected to row line $R_i$.

The output of the AND gate 150 is inverted by an invertor 154, whose output is supplied to AND gate 156. The read/write signal W is also supplied as an input to the AND gate 156. The output of the AND gate 156 is inverted by invertor 158, whose output is then supplied to a level shifter 159. The output of the level shifter 159 is supplied to the gate of a P type MOS transistor 160. One end of the source/drain of the P type MOS transistor 160 is connected to +7 volts. The other end of the drain/source of the transistor 160 is supplied to the row line $R_i$. The level shifter 159 changes the input voltage of 0/+5 to 0/+7 volts.

When the read/write signal W is high, indicating a read operation and the unselected row output signal, e.g. $r_a$ is low, this turns on transistor 160, connecting the unselected row line, e.g. $R_a$ to +7 volts. This condition also turns off transistor 152. When the read/write signal W is high and the selected row output signal $r_i$ is high, this turns on transistor 152, connecting the selected row line $R_i$ to 0 volts. This condition also turns off transistor 160. Thus, during a read operation, the selected row line $R_i$ is connected to 0 volts, and the unselected row lines $R_a$ . . . $R_{i-1}R_{i+1},R_n$ are all connected to +7 volts.

Figure 7:
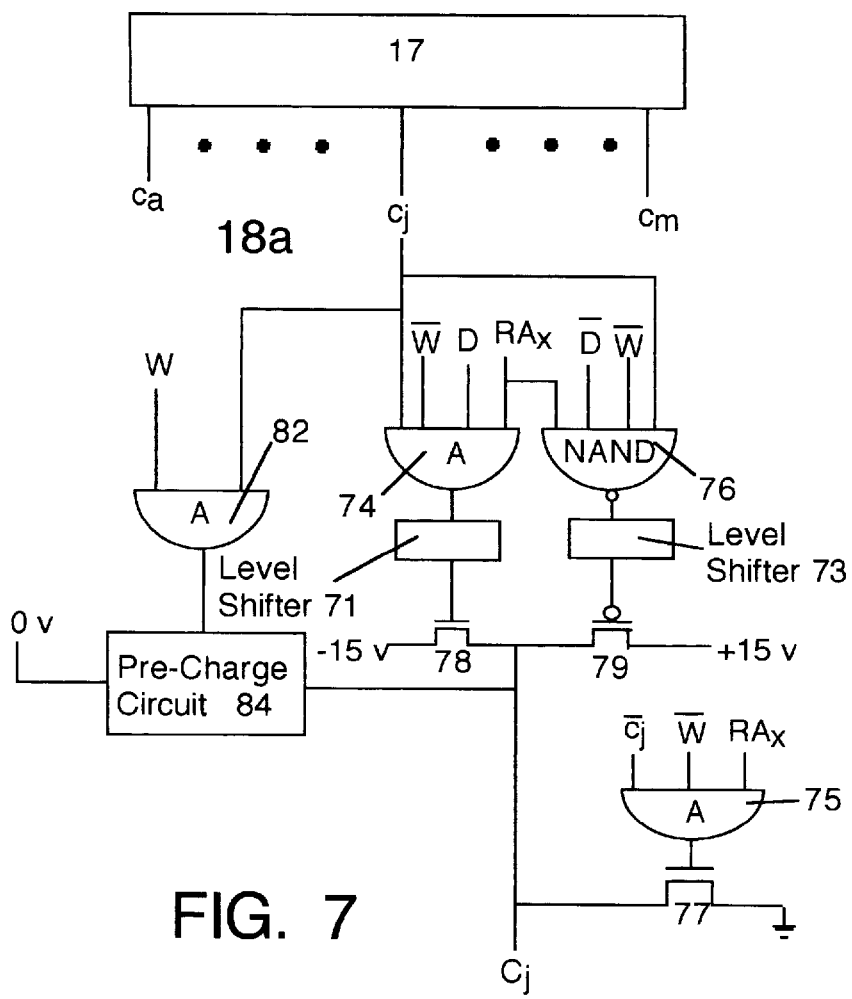
FIG. 7 is a circuit diagram of a portion of a column decoder suitable for use in the embodiment of the memory array circuit shown in FIG. 1.

A portion of the column decoder 18a, which can supply the necessary voltages described above, is shown in greater detail in FIG. 7. The column decoder 18a comprises a conventional column decoder 17, having column output signals $c_a$ . . . $c_m$. Each column output signal, e.g. $c_j$ is supplied to a first AND gate 74 and a NAND gate 76. The other inputs to the first AND gate 74 are the read/write signal $\overline{W}$, the input data signal D, and for the first memory section 12a, the row address signal $RA_x$. The other inputs to the NAND gate 76 are the read/write signal $\overline{W}$, the input data signal $\overline{D}$, and for the first memory section 12a, the row address $RA_x$.

The output of the first AND gate 74 is supplied to a level shifter 71 whose output is supplied to the gate of a NMOS transistor 78. One of the drain/source regions of the transistor 78 is connected to the column line $C_j$. The other drain/source region of the transistor 78 is connected to −15 volts. The output of the NAND gate 76 is supplied a level shifter 73 whose output is supplied to the gate of a PMOS transistor 79. One of the drain/source regions of the transistor 79 is connected to the column line $C_j$. The other drain/source region of the transistor 79 is connected to +15 volts.

The level shifters 71 and 73 are used solely to change the level of the voltage from the output of the logic gates 74 and 76, which are assumed to have outputs of +5/+0 volts corresponding to logic states of "1" or high and "0" or low respectively. The level shifter 71 changes the level of the voltage from 0 volts and +5.0 volts to −15 volts and +5 volts, (or any voltage greater than −15 volts sufficient to turn on transistor 78), respectively. The level shifter 73 changes the level of the voltage from +5.0 volts and 0 volts to +15 volts and 0 volts, (or any voltage less than +15 volts sufficient to turn on transistor 79), respectively.

The column output signals $c_j$ is also AND gated with the read/write signal $\overline{W}$ and $RA_x$ by an AND gate 75. The output of the AND gate 75 is connected to the gate of an N type MOS transistor 77. One of the source/drain regions of the transistor 77 is connected to ground. The other drain/source region of the transistor 77 is connected to the column line $C_j$.

Finally, the column output signal $C_j$ is supplied to a second AND gate 82 to which the read/write signal W is also supplied. The output of the second AND gate 82 is used to activate a pre-charge circuit 84. The pre-charge circuit 84 is of conventional design, with one end connected to a 0 volt source, and the other end connected to the column line $C_j$. It can be as simple as a transistor.

Figure 9:
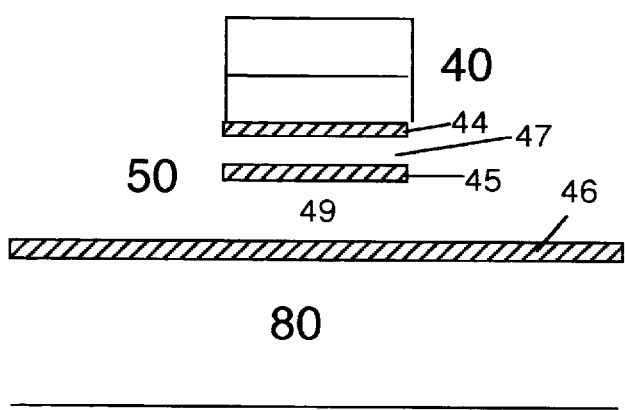
FIG. 9 is a cross sectional view of the construction of the first or second embodiment of the memory unit of FIGS. 2 or 8 in a semiconductor substrate.

A cross sectional view of the non-volatile cell 50 and the diode 40 as constructed in a semiconductor substrate 80 is shown in FIG. 9. The floating gate storage capacitor 50 is shown as a conventional stack gate type capacitor 50, with the second electrode 46 as a diffusion line in the substrate 80. Each of the floating gate 45 and first electrode 44 is shown as being "stacked" on top of one another and on the second electrode 46. Thus, the voltage coupling is very high. The avalanche diode 40 is shown as being made of polysilicon doped with appropriate dopants to form a PN junction. The diode 40 is formed in a polysilicon layer which is positioned "above" the floating gate storage capacitor 50.

Writing

The writing of the memory array circuit 10 with the non-volatile cell 50 to a state of "1" or the storage of charges on the floating gate 45 of the floating gate storage capacitor 50 is as follows.

During programming, the input signal D will be high. The conventional column decoder 17 will generate a high column output signal $c_j$. For a write operation the read/write signal $\overline{W}$ will be high. However, if the appropriate memory section 12a or 12b is selected then either $RA_x$ or $\overline{RA}_x$ will be on. This will be AND gated with the selected column output signal $c_j$, resulting in a high signal supplied to the gate of NMOS transistor 78, connecting the column line $C_j$ to −15 volts. The unselected column output signals, e.g. $c_a$, will be low, resulting in the output of AND gate 74 and NAND gate 76 being low and high respectively. This is not sufficient to turn on either transistor 78 or 79. However, AND gate 75 will turn on connecting each of the unselected column lines to ground.

The appropriate row decoder 16a or 16b will be selected. All of the unselected row output signals $r_a \ldots r_{(i-1)}$ $r_{(i+1)} \ldots r_n$ will be low. For a program operation D will be high. Thus, for the write circuit 24 associated with each unselected row output signal, e.g. $r_a$, the output of AND gate 52 will be high. This will cause the output of OR gate 55 to be high, which turns on transistor 60, connecting the unselected row line, e.g. $R_a$ to ground. Similarly, with the output of the OR gate 55 low, this would cause transistor 54 to be turned off.

For the write circuit 24 associated with the selected row output signal $r_i$, the output of AND gates 52 and 53 will be low. This will cause the output of OR gate 55 to be low, which turns off transistor 60. Since this is a write operation, the inversion of the output signal from the OR gate 55 by the invertor 56 will cause the output of AND gate 57 to be high. This then turns on the transistor 54, connecting the select row line $R_i$ to +15 volts.

Therefore, to program or to write a state of "1", the voltages for the selected memory unit 30ij is as follows: $C_j$ is at −15 volts, $R_i$ is at +15 volts. This is a voltage differential of −30 volts, and causes the diode 40 to reverse conduct, leaving a voltage differential of −15 volts between the first electrode 44 and the second electrode 46. This voltage differential is sufficient to cause electrons to Fowler-Nordheim tunnel from the first electrode 44 to the floating gate 45, resulting in electrons being stored on the floating gate 45. When the voltages are removed from the column line $C_j$ and row line $R_i$ the non-volatile capacitor 50 would have stored on its floating gate 45 a voltage of approximately −3 volts.

If a state of "0" is to be written into the non-volatile capacitor 50 defined by the intersection of column line $C_j$ and row line $R_i$, then the column decoder 17 will generate a high column output signal $c_j$. Since $\overline{D}$ will be high, AND gate 74 will output low, and NAND gate 76 will also output low. The low output of AND gate 74 will turn off transistor 78. The low output of NAND gate 76 will turn on transistor 79, connecting the column line $C_j$ to +15 volts. All unselected column lines, e.g. $C_a \ldots C_{(j-1)}C_{(j+1)} \ldots C_m$ will be connected to ground by the transistor 77 being on.

For an erase condition, the data signal $\overline{D}$ will be high. The row output signal $r_i$ will be high. Finally, the read/write signal $\overline{W}$ will also be high. This causes the AND gate 53 to output high, which causes the transistor 60 to turn on, thereby connecting $R_i$ to 0.0 volts. All unselected row output signals $r_a \ldots r_{(i-1)}r_{(i+1)} \ldots r_n$ will be at ground, causing the respective AND gates 52 and 53 to be at low. The low output of the OR gate 55 is passed through the invertor 56, and AND gate 57, turning on transistor 54, connecting the unselected row lines $R_a \ldots R_{(i-1)}R_{(i+1)} \ldots R_n$ to +15 volts.

Therefore, to erase or to write a state of "0", the voltages for the selected memory unit 30ij is as follows: $C_j$ is at +15 volts, $R_i$ is at 0.0 volts. This is a voltage differential of +15 volts, and causes the diode 40 to forward conduct, leaving a voltage differential of approximately +14.5 volts between the first electrode 44 and the second electrode 46. This voltage differential is sufficient to cause electrons to Fowler-Nordheim tunnel from the floating gate 45 to the first electrode 44, resulting in electrons being removed from the floating gate 45. When the voltages are removed from the column line $C_j$ and row line $R_i$ the non-volatile capacitor 50 would have charges removed from the floating gate 45.

Write Disturbance

In the write "1" operation, the voltage differential applied to the memory units 30 adjacent to the selected memory unit 30ij is as follows:

|  | unsel. col. | sel. col. | unsel. col. |
|---|---|---|---|
| unsel. row | 0 | −15 | 0 |
| sel. row | −15 | −30 | −15 |
| unsel. row | 0 | −15 | 0 |

For the memory units 30 having zero volt differential between the associated column line and the associated row line, the voltage is insufficient to cause the associated diode 40 to conduct.

For the memory units 30 having −15 volts differential between the associated column line and the associated row line, the voltage is sufficient just to cause the associated diode 40 to reverse conduct. However, that is insufficient to cause Fowler-Nordheim tunneling of the electrons from the first electrode 44 to the floating gate 45.

In the write "0" operation, the voltage differential applied to the memory units 30 adjacent to the selected memory unit 30ij is as follows:

|  | unsel. col. | sel. col. | unsel. col. |
|---|---|---|---|
| unsel. row | −15 | 0 | −15 |
| sel. row | 0 | +15 | 0 |
| unsel. row | −15 | 0 | −15 |

For the memory units 30 having zero volt differential between the associated column line and the associated row line, the voltage is insufficient to cause the associated diode 40 to conduct.

For the memory units 30 having −15 volts differential between the associated column line and the associated row line, the voltage is sufficient to cause the associated diode 40 to reverse conduct but insufficient to cause any charges to be programmed onto the floating gate 45.

As previously stated, during the write operation, the voltage applied to the selected row line $R_i$ depends upon the voltage applied to the selected column line $C_j$, and the forward and reverse conduction characteristics of the diode 40. Thus, if the diode 40 has the characteristics of +0.5 volts for forward conduction, and −5.0 volts for reverse conduction, the following voltages are also possible.

|  | $C_j$ | $C_i$ | $R_i$ | $R_j$ |
|---|---|---|---|---|
| Program | −10 | 0 | 10 | −5 |
| Erase | 8 | 0 | −7 | 8 |

In the program operation, the voltage differential applied to the memory units 30 adjacent to the selected memory unit 30ij is as follows:

|  | unsel. col. | sel. col. | unsel. col. |
|---|---|---|---|
| unsel. row | 5 | −5 | 5 |
| sel. row | −10 | −20 | −10 |
| unsel. row | 5 | −5 | 5 |

For the memory units 30 having −5.0 volt differential between the associated column line and the associated row line, the voltage is just sufficient to cause the associated diode 40 to reverse conduct.

For the memory units 30 having −10.0 volt differential between the associated column line and the associated row line, the voltage is sufficient to cause the associated diode 40 to reverse conduct. However, that is insufficient to cause Fowler-Nordheim tunneling of the electrons from the first electrode 44 to the floating gate 45.

For the memory units 30 having +5 volt differential between the associated column line and the associated row line, the voltage is sufficient to cause the associated diode 40 to forward conduct. However, that is insufficient to cause erasure of electrons from the floating gate 45.

In the write "0" operation, the voltage differential applied to the memory units 30 adjacent to the selected memory unit 30$ij$ is as follows:

|  | unsel. col. | sel. col. | unsel. col. |
|---|---|---|---|
| unsel. row | −8 | 0 | −8 |
| sel. row | +7 | +15 | +7 |
| unsel. row | −8 | 0 | −8 |

For the memory units 30 having zero volt differential between the associated column line and the associated row line, the voltage is insufficient to cause the associated diode 40 to conduct.

For the memory units 30 having +8 volts differential between the associated column line and the associated row line, the voltage is sufficient to cause the associated diode 40 to forward conduct but insufficient to cause any charges to be erased from the floating gate 45.

For the memory units 30 having −7.0 volts differential between the associated column line and the associated row line, the voltage is sufficient to cause the associated diode 40 to reverse conduct but insufficient to cause any charges to be programmed onto the floating gate 45.

The advantages of the foregoing voltages are that a diode 40 with lower reverse conduction voltage characteristics can be used, and lower voltages can be used.

Reading

The discussion which follows assumes the conditions for the avalanche diode 40 discussed previously, i.e. forward conduction of +0.5 volts, and reverse conduction of −15.0 volts. Furthermore, each of the reference memory cells 32 is assumed to be in the programmed condition, i.e. with electrons stored on the associated floating gate 45, causing a voltage of approximately −3 volts to be stored. To read a select memory cell 50, assume that the memory cell 50$ij$ is from the first memory section 12$a$. In that event row address signal $RA_x$ is high. In addition, for a read operation the read/write signal W is also high. The same select column line, e.g. $C_j$, of both memory sections 12$a$ and 12$b$ are first pre-charged. This can be done for example by applying a voltage source (0 volts) to the select column line $C_j$ of the first memory section 12$a$ and the select column line $C_j$ of the second memory section 12$b$, and equilibrating the two, i.e. connecting them together momentarily, then disconnecting the voltage source, and then maintaining the column lines $C_j$ of both memory sections 12$a$ and 12$b$ at floating.

From the previous discussion, the read control circuit 26 operates during the pre-charging operation to place +7 volts on all of the row lines, including the select row line $R_i$ of the select memory section 12$a$, and all of the row lines including the reference row line $R_{ref}$ of the unselect memory section 12$b$. In this condition, none of the diodes 40 is conducting. Furthermore, if any of the unselected memory cells 50 in the selected column $C_j$ of the select memory section 12$a$ is programmed, i.e. has −3 volts stored on the floating gate 45, the application of +7 volts to the second electrode 46 of those memory cells 50 would overcome the effect of the −3 volts inducing a charge on the first electrode 44, to cause the first electrode 44 to be more positive than −0.5 volts, thereby assuring that those diodes 40 would remain non-conductive.

The select row line $R_i$ of the select memory section 12$a$ and the reference row line $R_{ref}$ of the unselect memory section 12$b$ are lowered simultaneously to 0 volts. The charges on the select column line $C_j$ of the first and second memory sections 12$a$ and 12$b$ are differentially sensed. The result determines the state of charges in the select memory cell 50.

If the select memory cell 50 in first memory section 12$a$ is erased, i.e. with zero volts on the floating gate 45, the lowering of the voltage on the select row line $R_i$ would not cause the first diode 40 to conduct. There would be little if any charge drained from the select pre-charged column line $C_j$ of the first memory section 12$a$.

The reference memory unit 32 would also have the voltage of its associated row line $R_{ref}$ lowered. However, since the memory cell 50 of the select reference memory unit 32 is programmed, electrons stored on the floating gate 45 would induce a negative field on the near-by first electrode 44. This would cause the first electrode 44 to experience a negative voltage lowering it to below −0.5 volts. This would cause the diode 40 to conduct, thereby draining charges quicker from the select pre-charged column line $C_j$ of the second memory section 12$b$, than from the select pre-charged column line $C_j$ of the first memory section 12$a$. This difference in the amount of charges on the two column lines in the two memory sections 12$a$ and 12$b$ can be detected by the associated sense amplifier 14$_j$.

If the select memory cell 50 in first memory section 12$a$ is programmed, with approximately −3 volts on the floating gate 45, the lowering of the voltage on the select row line $R_i$ would induce a negative field on the near-by first electrode 44. This would cause the first electrode 44 to experience a negative voltage lowering it to below −0.5 volts. This would cause the diode 40 to conduct more than the erased condition. Because the select capacitor 50$ij$ is assumed to have greater capacitance than the capacitor 50 of the reference cell 32, charges would be drained quicker from the select pre-charged column line $C_j$ of the first memory section 12$a$, than from the select pre-charged column line $C_j$ of the second memory section 12$b$. This difference in the amount of charges on the two column lines in the two memory sections 12$a$ and 12$b$ can be detected by the associated sense amplifier 14$_j$.

Second Embodiment of A Memory Unit

Figure 8:
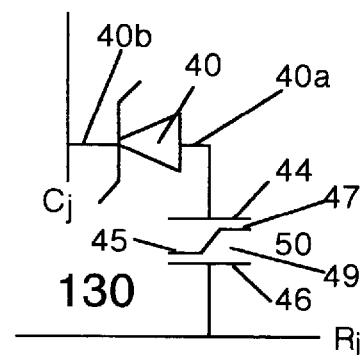
FIG. 8 is a circuit diagram of a second embodiment of a memory unit for use in the embodiment of the memory array circuit of the present invention shown in FIG. 1.

An alternative to the first embodiment of the memory unit 30 suitable for use in the memory array 10 is shown in FIG. 8. In the alternative embodiment, the memory unit 130 is similar to the memory unit 30. Therefore, like numerals will be used to designated identical parts. The memory unit 130 comprises a non-volatile memory capacitor 50 and an avalanche diode 40 having an anode 40$a$ and cathode 40$b$. The only difference from the memory unit 30 is that the anode 40$a$ is connected to the first electrode 44 and the cathode 40$b$ is connected to the column line $C_j$. The diode 40 is assumed to have the same threshold voltage, and reverse conduction characteristics as that for the embodiment shown in FIG. 2. The following voltages are assumed for writing and reading.

|  | $C_j$ | $C_i$ | $R_i$ | $R_j$ |
|---|---|---|---|---|
| Program | 0 | 15 | 15 | 0 |
| Erase | +15 | 0 | −15 | 0 |
| Read | 0 | f | +3 | 0 |

The reference units 32 are identical to the memory units 130, except they have one-half the size of the floating gate and capacitance.

Writing

To write "1", or to program, the selected column line $C_j$ is held at ground and the selected row line $R_i$. is brought to +15 volts. This causes the diode 40 to forward conduct, causing a voltage differential of +14.5 volts to be impressed between the second electrode 46 and the first electrode 44. This is sufficient to cause electrons to Fowler-Nordheim tunnel form the first electrode 44 to the floating gate 45, and to be stored on the floating gate 45. The unselected column lines $C_a \ldots C_{(j-1)}C_{(j+1)} \ldots C_m$ are held +15 volts. The unselected row lines $R_a \ldots R_{(i-1)}R_{(i+1)} \ldots R_n$ are held at 0 volts. Thus, for the unselected floating gate capacitors 50 in the unselected row $R_a$ but in the selected column $C_j$, the voltage differential is 0 volts. For the unselected floating gate capacitors 50 in the selected row $R_a$ but in the unselected column $C_j$, the voltage differential is also 0 volts. Finally for the unselected floating gate capacitors 50 in the unselected row $R_a$ and in the unselected column $C_j$, the voltage differential is −15 volts, which is insufficient to cause forward conduction, and just causes reverse conduction.

To write "0", or to erase, the select column line $C_j$ is brought to +15 volts. The select row line $R_i$ is brought to −15 volts. This is sufficient to cause the diode 40 to reverse conduct. In addition, it causes −15 volts to be applied between the second electrode 46 and the first electrode 44, causing electrons to Fowler-Nordheim tunnel from the floating gate 45 to the first electrode 44. The unselected column lines $C_a \ldots C_{(j-1)}C_{(j+1)} \ldots C_m$ are held 0 volts. The unselected row lines $R_a \ldots R_{(i-1)}R_{(i+1)} \ldots R_n$ are held at 0 volts. Thus, for the unselected floating gate capacitors 50 in the unselected row $R_a$ but in the selected column $C_j$, the voltage differential is −15 volts, which is insufficient to cause forward conduction, and just causes reverse conduction. For the unselected floating gate capacitors 50 in the selected row $R_a$ but in the unselected column $C_j$, the voltage differential is also −15 volts. Finally for the unselected floating gate capacitors 50 in the unselected row $R_a$ and in the unselected column $C_j$, the voltage differential is 0 volts.

Write Disturbance

The analysis for write disturbance for the embodiment of the memory unit 130 is similar to the discussion for the embodiment of the memory unit 30.

In the program operation, the voltage differential applied to the memory units 130 adjacent to the selected memory unit 130$ij$ is as follows:

|  | unsel. col. | sel. col. | unsel. col. |
|---|---|---|---|
| unsel. row | −15 | 0 | −15 |
| sel. row | 0 | +15 | 0 |
| unsel. row | −15 | 0 | −15 |

For the memory units 130 having zero volt differential between the associated column line and the associated row line, the voltage is insufficient to cause the associated diode 40 to conduct.

For the memory units 130 having −15 volt differential between the associated column line and the associated row line, the voltage is sufficient just to cause the associated diode 40 to reverse conduct. However, that is insufficient to cause Fowler-Nordheim tunneling of the electrons from the floating gate 45 to the first electrode 44.

In the erase operation, the voltage differential applied to the memory units 130 adjacent to the selected memory unit 130$ij$ is as follows:

|  | unsel. col. | sel. col. | unsel. col. |
|---|---|---|---|
| unsel. row | 0 | −15 | 0 |
| sel. row | −15 | −30 | −15 |
| unsel. row | 0 | −15 | 0 |

For the adjacent memory units 130 having zero volt differential between the associated column line and the associated row line, the voltage is insufficient to cause the associated diode 40 to conduct.

For the memory units 130 having −15 volt differential between the associated column line and the associated row line, the voltage is sufficient to cause the associated diode 40 to reverse conduct but insufficient to cause any charges to be erased from the floating gate 45 to the first electrode 44.

Reading

The read operation for the memory unit 130 is similar to the read operation for the memory unit 30. However, the memory cells 50 of the reference units 32 are assumed to be in a partially programmed condition, e.g. the floating gate 45 has a voltage of −1.5 volts. The column line $C_j$ of the memory section 12$a$ or 12$b$, containing the select memory capacitor 50, and the corresponding column line $C_j$ of the memory section 12$b$ or 12$a$ not containing the selected memory capacitor 50 are precharged to 0 volts.

To read a select memory cell 50, assume that the memory cell 50$ij$ is from the first memory section 12$a$. In that event row address signal $RA_x$ is high. In addition, for a read operation the read/write signal W is also high. The same select column line, e.g. $C_j$, of both memory sections 12$a$ and 12$b$ are first pre-charged. This can be done for example by applying a voltage source (0 volts) to the selected column line $C_j$ of the first memory section 12$a$ and the selected column line $C_j$ of the second memory section 12$b$, and equilibrating the two, i.e. connecting them together momentarily, then disconnecting the voltage source, and then maintaining the column lines $C_j$ of both memory sections 12$a$ and 12$b$ at floating.

A read control circuit, similar to the control circuit 26, operates during the pre-charging operation to place 0 volts on all of the row lines, including the select row line $R_i$ of the select memory section 12$a$, and all of the row lines including the reference row line $R_{ref}$ of the unselect memory section 12$b$. In this condition, none of the diodes 40 is conducting. Furthermore, if any of the unselected memory cells 50 in the selected column $C_j$ of the select memory section 12$a$ is programmed, i.e. has −3 volts stored on the floating gate 45, the application of 0 volts to the second electrode 46 of those memory cells 50 would not be sufficient to overcome the stored −3 volts on the floating gate 45 to raise the voltage on the first electrode 44 to be more positive than 0 volts, thereby assuring that those diodes 40 would remain non-conductive.

The select row line $R_i$ of the select memory section 12$a$ and the reference row line $R_{ref}$ of the unselect memory section 12$b$ are raised simultaneously to +3 volts. The charges on the select column line $C_j$ of the first and second memory sections 12$a$ and 12$b$ are differentially sensed. The result determines the state of charges in the select memory cell 50.

If the select memory cell 50 in first memory section 12$a$ is programmed, i.e. with −3 volts on the floating gate 45, the raising of the voltage on the select row line $R_i$ to +3 volts would still not be sufficient to overcome the voltage of the floating gate 45 influencing the first electrode 44, thereby keeping the diode 40 in a non-conductive state. There would be little if any charge drained from the select pre-charged column line $C_j$ of the first memory section 12$a$.

The memory cell 50 of the reference memory unit 32 is partially programmed. The raising of the voltage on the second electrode 46 is sufficient to raise the voltage on the first electrode 44 to cause the associated diode 40 to forward conduct, thereby adding more charges to the select precharged column line $C_j$ of the second memory section 12$b$, than to the select pre-charged column line $C_j$ of the first memory section 12$a$, with a programmed select memory cell 50. This difference in the amount of charges on the two column lines in the two memory sections 12$a$ and 12$b$ can be detected by the associated sense amplifier 14$_j$.

If the select memory cell 50 in first memory section 12$a$ is also erased, i.e. with 0 volts on the floating gate 45, the raising of the voltage on the select row line $R_i$ would induce a positive field on the near-by first electrode 44. This would cause the first electrode 44 to experience a voltage greater than +0.5 volts. This would cause the diode 40 to conduct. Because the select capacitor 50$ij$ is assumed to have greater capacitance than the capacitor 50 of the reference cell 32, more charges would be added to the select pre-charged column line $C_j$ of the first memory section 12$a$, than to the select pre-charged column line $C_j$ of the second memory section 12$b$. This difference in the amount of charges on the two column lines in the two memory sections 12$a$ and 12$b$ can be detected by the associated sense amplifier 14$_j$.

Second Embodiment of a Memory Array Circuit

Figure 10:
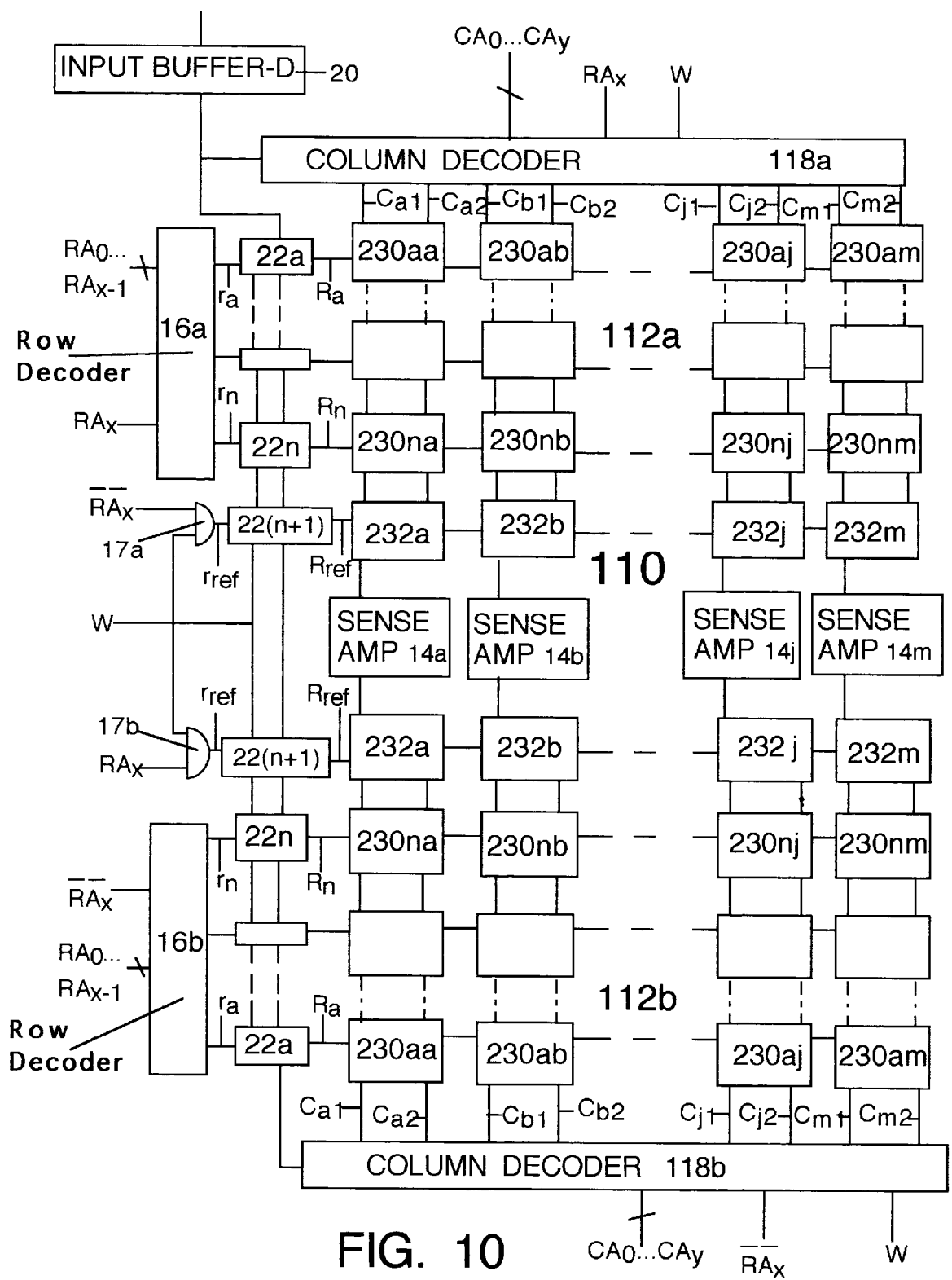
FIG. 10 is a schematic block level diagram of a second embodiment of a memory array circuit of the present invention, suitable for use with memory units comprising non-volatile memory cells.

Referring to FIG. 10 there is shown a block diagram of a second embodiment of a semiconductor memory array circuit 110 of the present invention. The array circuit 110 is very similar to the array circuit 10 shown in FIG. 1 and as described above. Therefore, like numerals will be used for same or similar parts.

The basic difference between the array circuit 110 and the array circuit 10 is that each of the memory units 230 in the array 110 uses two P-N junction diodes 241 rather than a single avalanche diode 40. The array circuit 10 is the preferred embodiment of the present invention. However, if the manufacturability of the memory units 30 or 130, requiring avalanche diodes 40 having precise forward conduction threshold, and reverse conduction threshold for millions of memory units 30 or 130 in an array circuit 10, is difficult to achieve, then array circuit 110 is preferred. As a result of using two P-N junction diodes 241, the array circuit 110 has two column lines for each memory unit 230 aligned in the same column.

Similar to the array circuit 10, the array circuit 110 comprises two sections of memory cells: first memory section 112$a$ and second memory section 112$b$. The first memory section 112$a$ comprises a plurality of data memory units 230$aa$ . . . 230$nm$ arranged in a plurality of n rows and a plurality of m columns, connected by a plurality of n row lines $R_a$ . . . $R_n$ and a plurality of pairs of m column lines $C_{a1}C_{a2}$ . . . $C_{m1}C_{m2}$. The first memory section 112$a$ also comprises a plurality of reference memory units 232$a$ . . . 232$m$, connected by a reference row line $R_{ref}$, with one reference memory unit 232, e.g. 232$j$, connected to a different pair of column lines $C_{j1}C_{j2}$ of the first memory section 112$a$.

The second memory section 112$b$ also comprises a plurality of data memory units 230$aa$ . . . 230$nm$ also arranged in a plurality of n rows and a plurality of m columns, connected by a plurality of n row lines $R_a$ . . . $R_n$, and a plurality of pairs of m column lines $C_{a1}C_{a2}$ . . . $C_{m1}C_{m2}$. The second memory section 112$b$ also comprises a plurality of reference memory units 232$a$ . . . 232$m$, connected by a reference row line $R_{ref}$, with one reference memory unit 232, e.g. 232$j$, connected to a different pair of column lines $C_{j1}C_{j2}$ of the second memory section 112$b$.

Figure 11:
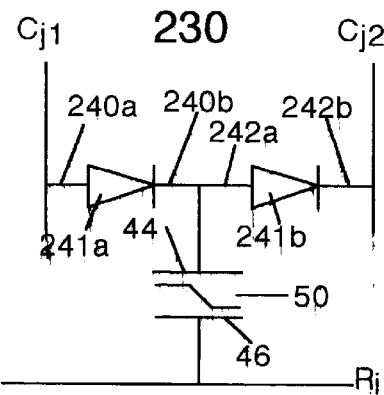
FIG. 11 is a circuit diagram of a third embodiment of a memory unit for use in the second embodiment of the memory array circuit shown in FIG. 10.

Each of the memory units 230 and the reference units 232 comprises a non-volatile memory cell 50 which is in the nature of a floating gate capacitor, shown in FIG. 11. The reference memory units 232 and the data memory units 230 are identical except for the size of the capacitor 50 for storing the amount of charges.

A sense amplifier 14 connects one of the pairs of column lines, e.g. $C_{j1}$, in each column of the first memory section 112$a$ to a corresponding one of the pairs of column line, e.g. $C_{j1}$, in each column of the second memory section 212$b$. The sense amplifier 14, e.g. 14$_j$, differentially senses the charges on a column line, e.g. $C_{j1}$, of the first memory section 112$a$, caused by a data memory unit 230, e.g. any of the memory units 230$aj$ . . . 230$nj$, of the first memory section 112$a$ being connected thereto, with the charges on a corresponding column line $C_{j1}$, of the second memory section 112$b$, caused by a reference memory unit, e.g. 232$j$ of the second memory section 112$b$ being connected thereto. The output of each sense amplifier 14 is supplied to an output buffer (not shown).

Within the first memory section 112$a$, the circuit 110 comprises a first row decoder 16$a$ for receiving and decoding a row address signal $RA_0$ . . . $RA_{(x-1)}$. The first row decoder 16$a$ also receives the row address signal $RA_x$. The first row decoder 16$a$ decodes the row address signal $RA_0$ . . . $RA_{(x-1)}$, if the row address signal $RA_x$ is high. The output of the first row decoder 16$a$ is a plurality of row output signals, $r_a$ . . . $r_n$. Each of the row output signals $r_a$ . . . $r_n$ of the first row decoder 16$a$ is supplied to a control circuit 22$a$ . . . 22$n$ (shown in FIGS. 3–5 and described above) and has a corresponding row line $R_a$ . . . .$R_n$. The row address signal $\overline{RA_x}$ and the read/write signal W are supplied to an AND gate 17$a$, to generate the row output signal $r_{ref}$. The row output signal $r_{ref}$ is similar to the row output signals $r_a$ . . . $r_n$ in that it is supplied to a control circuit 22(n+1), which can be identical to the other control circuits 22, and has a corresponding reference row line $R_{ref}$ which is connected to all the reference memory units 232. As previously discussed, each of the control circuits 22 receives a row output signal $r_a$ . . . $r_n, r_{ref}$ and the read/write signal W and the state of the input signal D, and in response thereto, supplies an appropriate control signal to its corresponding row line $R_a$ . . . $R_n, R_{ref}$.

Within the second memory section 112$b$, the circuit 110 comprises a second row decoder 16$b$ for receiving and decoding a row address signal $RA_0$ . . . $RA_{(x-1)}$, which is the same row address signal supplied to the first row decoder 16$a$. The second row decoder 16$b$ also receives the row address signal $\overline{RA_x}$. The second row decoder 16$b$ decodes the row address signal $RA_0$ . . . $RA_{(x-1)}$, if the row address signal $\overline{RA_x}$ is high. Thus, although the same row address signal $RA_0$ . . . $RA_{(x-1)}$ is supplied to both the first row decoder 16$a$ and the second row decoder 16$b$, only one of them will be activated at any time, depending upon the row address signal $RA_x$.

Similar to the first row decoder 16$a$, the second row decoder 16$b$ has a plurality of row output signals, $r_a$ . . . $r_n$. Each of the row output signals $r_a$ . . . $r_n$ of the second row decoder 16$b$ is connected to a control circuit 22$a$ . . . 22$n$ and has a corresponding row line $R_a$ . . . $R_n$. The row address signal $RA_x$ and the read/write signal W are supplied to an AND gate 17$b$ to generate the row output signal $r_{ref}$. The row output signal $r_{ref}$ is similar to the row output signals $r_a$ . . .

$r_n$ in that it is supplied to a control circuit 22(n+1), which can be identical to the other control circuits 22, and has a corresponding row line $R_{ref}$ which is connected to all the reference memory units 232. Each of the control circuits 22 receives one of the row output signals $r_a \ldots r_n, r_{ref}$ and the read/write signal W and the state of the input signal D, and in response thereto supplies an appropriate control signal to its corresponding row line $R_a \ldots R_n, R_{ref}$.

Within the first memory section 112a, the circuit 110 comprises a first column decoder 118a. The first column decoder 118a receives the column address signal $CA_0 \ldots CA_y$, the row address signal $RA_x$, the read/write signal W, and the input signal D. In response, the first column decoder 118a applies various voltages to the column lines $C_{a1} \ldots C_{m1}$ and their associated column lines $C_{a2} \ldots C_{m2}$.

Within the second memory section 112b, the circuit 110 comprises a second column decoder 118b. The second column decoder 118b receives the same column address signal $CA_0 \ldots CA_y$, as received by the first column decoder 118a, and the row address signal $\overline{RA_x}$, the same read/write signal W, and the same input signal D. In response, the second column decoder 118b also applies various voltages to the column lines $C_{a1} \ldots C_{m1}$ and their associated column lines $C_{a2} \ldots C_{m2}$. The first column decoder 118a is activated if the read/write signal W is high (indicating a read operation), or if the signal $RA_x$ is high. The second column decoder 118b is activated if the read/write signal W is high (indicating a read operation), or if the signal $\overline{RA_x}$ is high. Thus, in the event the read/write signal W is high, indicating a read operation, both column decoders 118a and 118b are activated. Since they both receive the same column address signal $CA_0 \ldots CA_y$, the same column line $C_{j1}$ will be chosen, causing the sense amp 14j to sense differentially the charges on the column line $C_{j1}$ of the first memory section 112a from the column line $C_{j1}$ of the second memory section 112b. In the event the read/write signal W is low, indicating a write operation, then only one of the column decoders 118a or 118b will be active. The choice of the column decoder 118a and 118b that will be active is determined by the signal $RA_x$ and $\overline{RA_x}$. If $RA_x$ is high, then only first column decoder 118a and first row decoder 16a will be active, thereby activating only the column and row lines of the first memory section 112a. If $\overline{RA_x}$ is high, then only second column decoder 118b and second row decoder 16b will be active, thereby activating only the column and row lines of the second memory section 112b.

The array 110 also comprises a conventional input buffer 20 for receiving a data signal D that is to be stored in one of the plurality of memory units 230aa . . . 230nj of either the first memory section 112a or the second memory section 112b. The input signal D is supplied to each of the control circuits 22. Finally, the circuit 110 receives the read/write signal W, which is also supplied to each of the control circuits 22.

Referring to FIG. 11, there is shown a memory unit 230 suitable for use with the circuit 110. The memory unit 230 comprises a non-volatile memory cell 50, which can be identical to the floating gate capacitor shown and described in FIG. 2. The floating gate storage capacitor 50 has a first electrode 44, a second electrode 46, and a floating gate 45 therebetween. Between the first electrode 44 and the floating gate 45 is a first insulating layer 47, such as silicon dioxide or silicon nitride, or combination thereof. Between the floating gate 45 and the second electrode 46 is a second insulating layer 49, such as silicon dioxide or silicon nitride, or combination thereof. The second electrode 46 is connected to the associated row line $R_i$. In the preferred embodiment, the first insulating layer 47 is of the thickness on the order of 50–100 angstroms, which permits electrons to Fowler-Nordheim tunnel from the first electrode 44 to the floating gate 45, and vice versa. Thus, in this manner, electrons are stored on the floating gate 45. However, the storage and removal of the electrons from the floating gate 45 can also be done through Fowler-Nordheim tunneling through the second insulating layer 49, to and from the second electrode 46.

A first PN-junction diode 241a has a first anode 240a and a first cathode 240b. The first anode 240a is connected to the associated first column line $C_{j1}$. The first cathode 240b is connected to the first electrode 44. A second PN-junction diode 241b has a second anode 242a and a second cathode 242b. The second cathode 242b is connected to the associated second column line $C_{j2}$. The second anode 242a is connected to the first electrode 44. The diodes 241a and 241b can be made out of polysilicon and can be placed above the silicon substrate 80. Alternatively, the diodes 241a and 241b can be fabricated in the semiconductor substrate 80 with the capacitor 50 thereby fabricated "above" the diodes 241.

Again, similar to the foregoing discussion, the principle of operation for programming and erasing of the memory unit 230 is that it depends upon the voltage differential between the selected first column line $C_{j1}$, and the selected row line $R_i$ to cause a forward conduction of the first diode 241a to erase, and it depends upon the voltage differential between the selected second column line $C_{j2}$, and the selected row line $R_i$ to cause a forward conduction of the second diode 241b to program. Thus, the control circuit 22 supplies a voltage to the select row line $R_i$ to cause a program or erase operation, depending upon the voltage that is applied to the selected first column line $C_{j1}$ or to the second column line $C_{j2}$ as the case may be.

Furthermore, the principle of operation for reading the state of the memory unit 230 also depends upon the voltage precharged on the selected first column line $C_{j1}$ and the selected row line $R_i$ to cause a forward conduction of the first diode 241a, depending upon the charges stored on the floating gate 45 of the capacitor 50.

Therefore, for both read and write operation, an embodiment of the control circuit 22 shown in FIG. 3 is only one of many possible embodiments depending upon the voltage of the selected column line. Furthermore, for purpose of this discussion, each of the first and second diodes 241a and 241b is assumed to have a forward bias threshold voltage of +0.5v. In addition, it is assumed that for Fowler-Nordheim tunneling of electrons from the first electrode 44 to the floating gate 45, a difference of +15 volts between the first electrode 44 and the second electrode 46 is needed. For Fowler-Nordheim tunneling of electrons from the floating gate 45 to the first electrode 44, a difference of +15 volts between the second electrode 46 and the first electrode 44 is needed. Finally, after electrons are stored on the floating gate 45, it is assumed that a voltage of −3 volts is stored thereon. For the purpose of describing the operation of the array circuit 110, the following voltages are assumed.

|  | $C_{j1}$ | $C_{j2}$ | $C_{i1}$ | $C_{i2}$ | $R_i$ | $R_j$ |
| --- | --- | --- | --- | --- | --- | --- |
| Program | 0 | 0 | 0 | 15 | 15 | 0 |
| Erase | 15 | 15 | 0 | 15 | 0 | 15 |
| Read | 0 | 7 | 7 | 7 | 0 | 7 | where program is to store electrons on the floating gate 45 of the select capacitor 50 defined at the intersection of column line $C_{j1}$ and row line $R_i$. Erase is to remove electrons from the floating gate 45 of the select capacitor 50 defined at the intersection of column line $C_{j2}$ and row line $R_i$. Read is to read the state of the charges stored on the floating gate 45 of the select capacitor 50 defined at the intersection of column line $C_{j1}$ and row line $R_i$. $C_{i(1\&2)}$ are unselected column lines. $R_j$ is an unselected row line.

Figure 12:
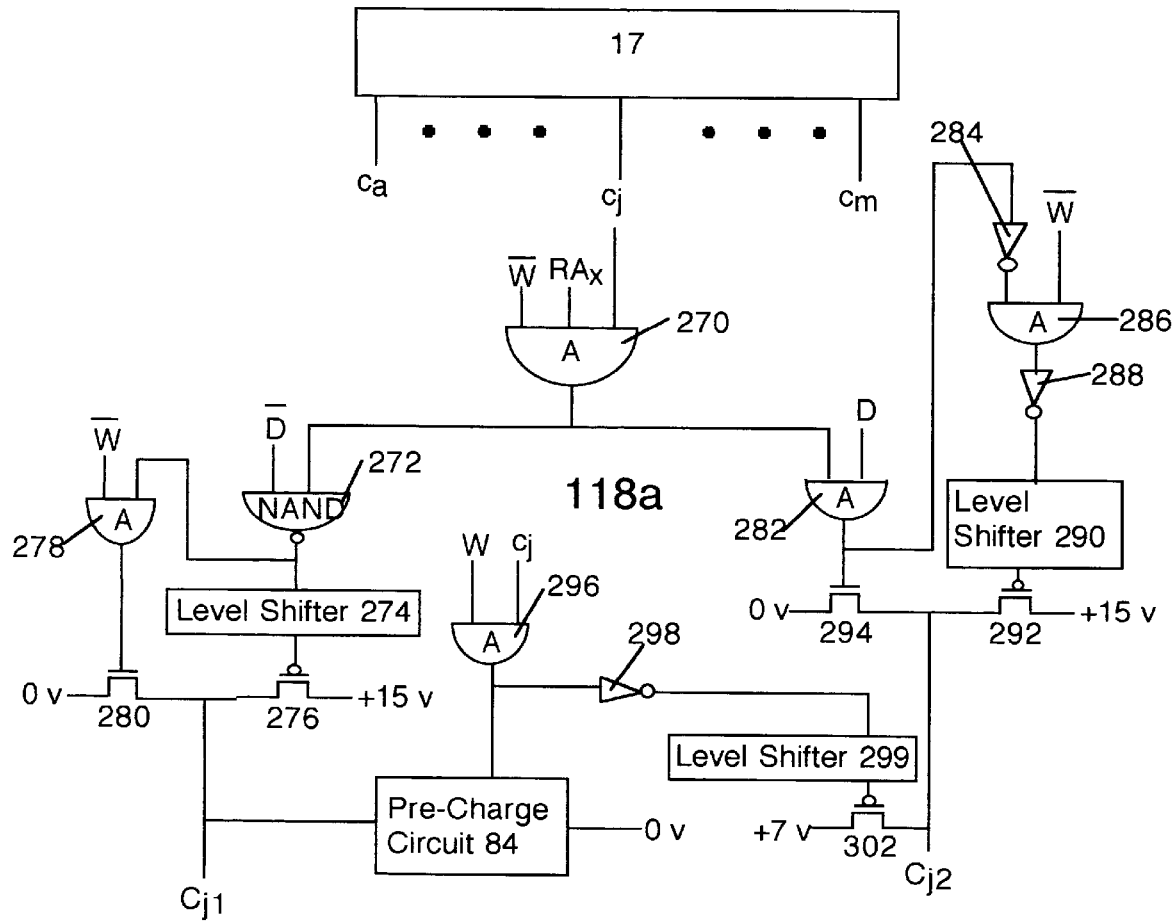
FIG. 12 is a circuit diagram of a portion of a column decoder suitable for use in the second embodiment of the memory array circuit shown in FIG. 10.

A portion of the column decoder 118a, which can supply the necessary voltages as described above, is shown in greater detail in FIG. 12. The column decoder 118a comprises a conventional decoder 17, having column output signals $c_a \ldots c_m$. The portion of the column decoder 118a which operates during the write operation comprises an AND gate 270 to which each column output signal, e.g. $c_j$ is supplied. The read/write signal $\overline{W}$ and the row address signal $RA_x$ are also supplied to the other inputs of AND gate 270. The output of the AND gate 270 is supplied as input to NAND gate 272 and AND gate 282, respectively.

The NAND gate 272 also receives as its input the data signal $\overline{D}$. The output of the NAND gate 272 is supplied to a level shifter 274, which shifts the voltage of the input signal supplied thereto from +5/0 volts to +15/0 volts. The output of the level shifter 274 is supplied to the gate a PMOS transistor 276. The source of the PMOS transistor 276 is connected to +15 volts. The drain of the PMOS transistor 276 is connected to column line $C_{j1}$. The output of the NAND gate 272 is also supplied as an input to an AND gate 278, with the read/write signal $\overline{W}$ also supplied as input thereto. The output of the AND gate 278 is supplied to the gate of a NMOS transistor 280. The source of the transistor 280 is connected to ground, with the drain connected to column line $C_{j1}$.

The input signal D is also supplied as an input to the AND gate 282. The output of the AND gate 282 is connected to the gate of the NMOS transistor 294, whose source is connected to ground, and whose drain is connected to column line $C_{j2}$. The output of the AND gate 282 is also inverted by invertor 284, with the output of the invertor 284 supplied as an input to AND gate 286. The other input of the AND gate 286 is the read/write signal $\overline{W}$. The output of the AND gate 286 is inverted by invertor 288, and is then shifted by a level shifter 290 from +5/0 volts to +15/0 volts. The output of the level shifter 290 is connected to the gate of a PMOS transistor 292, whose source is connected to +15 volts, and whose drain is connected to column line $C_{j2}$.

The portion of the column decoder 118 which is operational during the read operation consists of an AND gate 296, which receives as its input the column output signal $c_j$ and the read/write signal W. The output of the AND gate 296 is supplied to the pre-charge circuit 84, which has one end connected to the column line $C_{j1}$, and the other end connected to 0 volts. The output of the AND gate 296 is inverted by an invertor 298, whose voltage output is then shifted by a voltage level shifter 299 (from +5/0 volts to +7/0 volts). The output of the voltage level shifter 299 is connected to the gate of a PMOS transistor 302, whose source is connected to +7 volts, and whose drain is connected to column line $C_{j2}$.

Writing

The writing of the memory array circuit 110 with the non-volatile cell 50 to a state of "1" or the storage of charges on the floating gate 45 of the capacitor 50 is as follows. The conventional column decoder 17 will select column output signal $c_j$ and raise it to high. For a write operation the read/write signal $\overline{W}$ will be high. However, if the appropriate memory section 112a or 112b is selected then either $RA_x$ or $\overline{RA_x}$ will be on. This will all be AND gated by gate 270. For a program operation, data signal D will be high. This results in a high signal supplied to the gate of NMOS transistors 280 and 294, to connect column lines $C_{j1}$ and $C_{j2}$, respectively to 0 volts.

All of the other unselected column output signals, e.g. $c_a$, will be low, resulting in the output of AND gate 270 being low. This turns on transistors 280 and 292, causing 0 and +15 volts respectively to be supplied to column lines $C_{j1}$ and $C_{j2}$, respectively.

The operation of the write circuit 24 of the control circuit 22 has been discussed heretofore. For programming, the select row line $R_i$ is maintained at +15 volts, causing the diode 241b to forward conduct, permitting electrons to flow through the diode 241b onto the first electrode 44 and Fowler-Nordheim tunnel onto the floating gate 45.

For an erase operation, the column decoder 17 will selected column output signal $c_j$. For an erase operation $\overline{W}$ is high, data signal $\overline{D}$ is high, and $RA_x$ is high. The output of the gate 270 is high. This in turn causes transistors 276 and 292 to turn on, causing +15 volts to be applied to column lines $C_{j1}$ and $C_{j2}$, respectively. For erasing, the select row line $R_i$ is maintained at 0 volts, causing the diode 241a to forward conduct. This causes electrons from the floating gate 45 to Fowler-Nordheim tunnel onto the first electrode 44 and flow through the first diode 241a. this removes the electrons from the floating gate 45.

Write Disturbance

In the program operation, the write disturbance on the surrounding memory units 230 is as follows:

|  | unsel. col. |  | sel. col. |  | unsel. col. |  |
| --- | --- | --- | --- | --- | --- | --- |
|  | 1 | 2 | 1 | 2 | 1 | 2 |
| unsel. row | 0 | x | 0 | 0 | 0 | x |
| sel. row | x | 0 | x | f | x | 0 |
| unsel. row | 0 | x | 0 | 0 | 0 | x |

0 means 0 volt differential between the column line and the row line, x means a reverse bias of the diode, and f means forward conduction of the diode 241b.

In the erase operation, the write disturbance on the surrounding memory units 230 is as follows:

|  | unsel. col. |  | sel. col. |  | unsel. col. |  |
| --- | --- | --- | --- | --- | --- | --- |
|  | 1 | 2 | 1 | 2 | 1 | 2 |
| unsel. row | x | 0 | 0 | 0 | x | 0 |
| sel. row | 0 | x | f | x | 0 | x |
| unsel. row | x | 0 | 0 | 0 | x | 0 |

0 means 0 volt differential between the column line and the row line, x means a reverse bias of the diode, and f means forward conduction of the diode 241a.

Thus in both program and erase operation, the write disturbance on the neighboring memory units 230 is minimized.

Reading

To read a select memory cell 50 of a memory unit 230, assume that the memory unit 230 is from the first memory section 112a. In that event row address signal $RA_x$ is high. In addition, for a read operation the read/write signal W is also high. The same select column line, e.g. $C_j$, of both memory sections 112a and 112b are first pre-charged. This can be done for example by applying a voltage source to the selected first column line $C_{j1}$ of the first memory section 112a and the corresponding selected first column line $C_{j1}$ of the second memory section 112b, and equilibrating the two, i.e. connecting them together momentarily, then disconnecting the voltage source. During the pre-charging operation, the second column line $C_{j2}$ associated with the select first column line $C_{j1}$ are held at +7 volts. In addition, all of the row lines, including the select row line $R_i$ of the select memory section 112a, and all of the row lines including the reference row line $R_{ref}$ of the unselect memory section 112b are also held at +7 volts. In this condition, none of the diodes 241a or 241b is conducting.

The select row line $R_i$ of the select memory section 112a and the reference row line $R_{ref}$ of the unselect memory section 112b are lowered simultaneously to +0 volts. The charges on the select first column lines $C_{j1}$ of the first and second memory sections 112a and 112b are differentially sensed. The result determines the state of charges in the select memory cell 50.

If the select memory cell 50 in first memory section 112a has its floating gate 45 programmed, i.e. the floating gate 45 has electrons stored thereon bringing the voltage to −3 volts, the negative voltage on the floating gate 45 would induce a negative field on the first electrode 44, lowering it to below −0.5 volt, the condition which would cause the first diode 241a to conduct.

The reference memory units 232 are all assumed to be programmed, i.e. all have their floating gates charged to −3 volts. The lowering of the voltage on the reference row line $R_{ref}$ would also induce the first diode 241a of the reference unit 232 to conduct. However, since the memory cell 50 of the select memory unit 230 has a larger capacitance than the capacitor 50 of the reference memory unit $232_j$, the amount of charge drained from the first column line $C_{j1}$ of the first memory section 112a would be greater than the amount of charge drained from the column line $C_{j1}$ of the second memory section 112b.

If the select memory cell 50 is erased, i.e. with no electrons stored on its floating gate 45, then the lowering of the voltage on the row line $R_1$ of the first memory section 212a would cause the first diode 241a to conduct little if any charges from the first column line $C_{j1}$ of the first memory section 112a. However, the reference memory unit $232_j$ would have its associated first diode 241a in a forward conduction mode. Thus, the first column line $C_{j1}$ of the second memory section 112b would cause more charges to be drained than the first column line $C_{j1}$ of the first memory section 112a. Again the differential sensing of the charges on the first column lines $C_{j1}$ of the first memory section 112a and the second memory section 112b can determine the state of the charges of the selected memory cell 50.

From the foregoing it can be seen that various embodiments of a memory array circuit using diodes to transfer charges to a non-volatile capacitor results in greater compactness of the memory array circuit. Transistors with their planar requirement are not used. In addition, it should be noted that the term column lines and row lines can be interchanged.

Although the invention has been described as being used with a non-volatile storage cell 50, it should be clear that the invention can also be used with a latch as the memory cell 50 or a DRAM as the memory cell 50. Reference is made to U.S. patent applications, U.S. Ser. No. 08/735,661 entitled "SRAM MEMORY CIRCUIT AND METHOD OF OPERATION THEREFOR", now U.S. Pat. No. 5,671,182, and U.S. Ser. No. 08/735,660 entitled "MEMORY CIRCUIT AND METHOD OF OPERATION THEREFOR" filed even date herewith, whose disclosures are incorporated herein in their entirety by reference, which describes the use of the invention with a latch as the memory cell 50 or a DRAM as the memory cell 50, respectively.

What is claimed is:

1. A memory circuit comprising:
   a plurality of first lines;
   a plurality of second lines;
   said plurality of first lines and plurality of second lines defining a matrix;
   a plurality of non-volatile storage cells arranged in said matrix, with each non-volatile storage cell having a data node and a voltage node; each of said plurality of non-volatile storage cells having an associated first line and an associated second line, with said voltage node connected to said associated second line;
   a plurality of avalanche diode means, each avalanche diode means connecting the data node of a non-volatile storage cell to its associated first line;
   first decoder means for decoding a first address signal and for selecting one of said plurality of first lines, in response thereto;
   second decoder means for decoding a second address signal and for generating one of a plurality of output signals in response thereto, each of said plurality of output signals having a corresponding second line; and
   a plurality of voltage control means each for receiving one of said plurality of output signals, and for applying a control signal to said corresponding second line, in response to a data read signal, a data write to one state signal or a data write to another state signal.

2. The memory circuit of claim 1 wherein said non-volatile storage cell is a non-volatile capacitor comprising a first electrical connection as said data node, a second electrical connection as said voltage node, a floating gate therebetween, a first insulating layer between said first electrical connection and said floating gate, and a second insulating layer between said second electrical connection and said floating gate, where in said first insulating layer for permitting Fowler-Nordheim tunnelling of charges between said floating gate and said first electrical connection.

3. The memory circuit of claim 2 wherein said plurality of non-volatile capacitors are defined in a plurality of rows and columns with the non-volatile capacitors in the same column having the same associated column line, with the non-volatile capacitors in the same row having the same associated row line, and wherein one of said plurality of non-volatile capacitors in each column is a reference capacitor.

4. The memory circuit of claim 3 further comprising:
   means for precharging one of said column lines to a first voltage, and another of said column lines to said first voltage; and
   means for differentially sensing the charges on said one column line with the charges on said another column line;
   wherein said first decoder means and said second decoder means selects a non-volatile capacitor connected to said one column line, and selects a reference capacitor connected to said another column line.

5. An electrically erasable programmable non-volatile memory device comprising:
   a plurality of first address lines;
   a plurality of second address lines;
   a plurality of non-volatile capacitors arranged in a matrix in a plurality of substantially parallel first lines and a plurality of substantially parallel second lines, with the plurality of first lines substantially perpendicular to the plurality of second lines, each of said plurality of non-volatile capacitors having a first electrical connection, a second electrical connection, and a floating gate therebetween; wherein each of the non-volatile capacitors arranged in the same first line has the same associated first address line, and wherein each of the non-volatile capacitors arranged in the same second line, has the same associated second address line, with the second electrical connection of each of the non-volatile capacitors connected thereto;

a plurality of first diodes, each first diode having a first terminal and a second terminal, with said first terminal connected to the first electrical connection of one of said plurality of non-volatile capacitors, and said second terminal connected to an associated first address line;

first address decoder connected to said plurality of first address lines for receiving a first address signal and for selecting one of said first address lines, in response thereto;

second address decoder for receiving a second address signal and for generating one of a plurality of output signals in response, thereto, each of said plurality of output signals having a corresponding second address line;

wherein the selection of one of said first address lines and one of said second address lines defines a select non-volatile capacitor; and a plurality of voltage control circuits, each for receiving one of said plurality of output signals, and for applying a control signal to a corresponding second address line, in response to a data read signal, a data write to one state signal or a data write to another state signal.

6. The electrically erasable programmable non-volatile memory device of claim 5 wherein each of said first diodes is an avalanche diode.

7. The electrically erasable programmable non-volatile memory device of claim 5 wherein one of said plurality of non-volatile capacitors in each first line is a reference capacitor.

8. The electrically erasable programmable non-volatile memory device of claim 7 further comprising:

a precharging circuit connecting one of said first address lines to a precharge voltage, and another of said first address lines to said precharge voltage; and a differential sensing circuit for sensing the charges on said one first address line and the charges on said another first address line;

wherein said second address decoder and said first address decoder are adapted to select a non-volatile capacitor connected to said one first address line, and to select a reference capacitor connected to said another first address line.

9. The electrically erasable programmable non-volatile memory device of claim 5 further comprising:

a plurality of third address lines, each of said third address lines having an associated first address line; and wherein said plurality of non-volatile capacitors arranged in the same first line have the same associated first and third address lines and with the non-volatile capacitors in the same second line having the same associated second address line;

a plurality of second diodes, each second diode having a third terminal and a fourth terminal, with said third terminal connected to the first electrical connection of one of said plurality of non-volatile capacitors, and said fourth terminal connected to an associated third address line; and wherein said first address decoder further connected to said plurality of third address lines adapted to select one of said third address lines.

10. The electrically erasable programmable non-volatile memory device of claim 9, wherein each of said plurality of first address lines associated with the non-volatile capacitors arranged in the same first line is substantially parallel to the associated third address line associated with the same non-volatile capacitors arranged in the same first line, and wherein said first address decoder selects a first address line and said second address decoder selects a second address line for storing a first charge on a floating gate of a non-volatile capacitor associated with said first address line and said second address line; and wherein said first address decoder selects a third address line, associated with said first address line, and said second address decoder selects said second address line for storing a second charge on a floating gate of said capacitor.

11. The electrically erasable programmable non-volatile memory device of claim 10 wherein each of said first diodes is a junction diode.

12. The electrically erasable programmable non-volatile memory device of claim 10 wherein one of said plurality of non-volatile capacitors in each first line is a reference capacitor.

13. The electrically erasable programmable non-volatile memory device of claim 12 further comprising:

a precharging circuit connecting one of said first address lines to a precharge voltage, and another of said first address lines to said precharge voltage; and a differential sensing circuit for sensing the charges on said one first address line and the charges on said another first address line;

wherein said second address decoder and said first address decoder are adapted to select a non-volatile capacitor connected to said one first address line, and to select a reference capacitor connected to said another first address line.

14. A method of minimizing write disturbance on a select non-volatile storage cell of a memory device to one state, said memory device having a plurality of first address lines, a plurality of second address lines, a plurality of non-volatile storage cells, arranged in a plurality of first lines and second lines, each of said plurality of storage cells having a first electrical connection, a second electrical connection, and a floating gate therebetween; wherein each of the storage cells arranged in the same first line has the same associated first address line, and wherein each of the storage cells arranged in the same second line has the same associated second address line, with the second electrical connection of each of the storage cells connected thereto; a plurality of diodes, each diode having a first terminal and a second terminal, with said first terminal of one of said plurality of diodes connected to the first electrical connection of said select storage cell, and said second terminal of said one diode connected to an associated first address line; a first address decoder connected to said plurality of first address lines for selecting one of said first address lines; a second address decoder for selecting one of said plurality of second address lines; said method comprising:

applying a first voltage to a select one of said plurality of first address lines;

applying a second voltage to a select one of said second address lines, thereby selecting said select storage cell defined by said one first address line, and said one second address line;

causing Fowler-Nordheim tunneling of charges from said first electrical connection to said floating gate to write said select storage cell to said one state; and applying said first voltage to all of said second address lines, other than said one second address line.

15. A method of writing a select non-volatile capacitor of a memory device to one state or another state, said non-volatile capacitor having a first electrical connection, a second electrical connection and a floating gate therebetween, said memory device having a plurality of first address lines, a plurality of second address lines, a plurality of third address lines, a plurality of non-volatile capacitors, arranged in a plurality of first and second lines, each of said plurality of capacitors having said first electrical connection and said second electrical connection; wherein each of the non-volatile capacitors arranged in the same first line has the same associated first address line and the same associated second address line, and wherein each of the non-volatile capacitors arranged in the same second line has the same associated third address line, with the second electrical connection of each of the non-volatile capacitors connected thereto; a plurality of first diodes, each first diode having a first anode and a first cathode, with said first cathode of one of said plurality of first diodes connected to the first electrical connection of said select non-volatile capacitor, and said first anode of said one first diode connected to an associated first address line; a plurality of second diodes, each second diode having a second anode and a second cathode, with said second anode of one of said plurality of second diodes connected to the first electrical connection of said select non-volatile capacitor, and said second cathode of said one second diode connected to an associated second address line; first address decoder connected to said plurality of first and second address lines for selecting one of said first or second address lines; and second address decoder connected to said plurality of third address lines for selecting one of said plurality of third address lines; said method comprising:

writing said select non-volatile capacitor to one state by:
applying a first voltage to a select one of said plurality of first address lines;
applying a second voltage to a select one of said third address lines, thereby selecting said select non-volatile capacitor defined by said one first address line, and said one third address line;
causing Fowler-Nordheim tunneling of charges from said first electrical connection to said floating gate to write said select non-volatile capacitor to said one state; and writing said select non-volatile capacitor to another state by:
applying a third voltage to a select one of said plurality of second address lines, said select one second address line associated with said select one first address line;
applying a fourth voltage to said select one third address line;
causing Fowler-Nordheim tunneling of charges from said floating gate to said first electrical connection to write said select non-volatile capacitor to said another state.

16. A method of reading a select non-volatile storage capacitor of a memory device, said non-volatile storage capacitor having a first electrical connection, a second electrical connection, and a floating gate therebetween, said non-volatile storage capacitor written to a state by having charges stored on said floating gate, said memory device having a plurality of first address lines, a plurality of second address lines, a plurality of non-volatile storage capacitors, said plurality of non-volatile storage capacitors arranged in a plurality of first and second lines with a reference non-volatile storage capacitor in each first line, said reference non-volatile storage capacitor having a floating gate different from said floating gate of said select non-volatile storage capacitor, each of the storage capacitors and reference storage capacitor arranged in the same first line has the same associated first address line, and wherein each of the storage capacitors and reference storage capacitor arranged in the same second line has the same associated second address line, with the second electrical connection of each of the storage capacitors and reference storage capacitor connected thereto; a plurality of diodes, each diode having a first terminal and a second terminal, with said first terminal connected to the first electrical connection, and said second terminal connected to an associated first address line; first address decoder for selecting one of said first address lines; second address decoder for selecting one of said plurality of second address lines, said method comprising:

applying a first voltage to all of said plurality of second address lines; while precharging one of said plurality of first address lines to said first voltage and another of said plurality of first address lines to said first voltage;

changing said first voltage to a second voltage of one of said plurality of second address lines thereby selecting said select storage capacitor defined by said one second address line and said one first address line;

simultaneously changing said first voltage to a second voltage of another of said plurality of second address lines thereby selecting a select reference storage capacitor defined by said another second address line and said another first address line;

differentially sensing the charge on said one first address line and an another first address line to determine the state of said select storage capacitor.

17. A non-volatile memory cell comprising:

a storage capacitor, having a first electrode, a second electrode, a floating gate therebetween, a first insulating layer between said first electrode and said floating gate, and a second insulating layer between said floating gate and said second electrode; said first insulating layer of a dimension permitting Fowler-Nordheim tunneling of electrons from said first electrode to said floating gate and from said floating gate to said first electrode; and a first diode, having a first terminal and a second terminal, with said first terminal connected to said first electrode of said storage capacitor.

18. The non-volatile memory cell of claim 17 wherein said diode is an avalanche diode, and wherein said first terminal is a cathode and said second terminal is an anode.

19. The non-volatile memory cell of claim 17 wherein said diode is an avalanche diode, and wherein said first terminal is an anode and said second terminal is a cathode.

20. The non-volatile memory cell of claim 17 wherein said first diode is a junction diode, with said first terminal as a cathode and said second terminal as an anode, and further comprising:

a second junction diode, having a cathode and an anode, with said anode connected to said first electrode of said storage capacitor.

* * * * *